US012610808B2

(12) United States Patent
Chen et al.

(10) Patent No.: US 12,610,808 B2
(45) Date of Patent: Apr. 21, 2026

(54) SEMICONDUCTOR STRUCTURE INCLUDING INSULATING VACANCY FOR IMPROVING OPERATION PERFORMANCE AND METHOD OF FABRICATING THE SAME

(71) Applicant: Industrial Technology Research Institute, Hsinchu (TW)

(72) Inventors: Shang-Chun Chen, Hsinchu City (TW); Po-Chun Yeh, Taichung City (TW); Pei-Jer Tzeng, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 1017 days.

(21) Appl. No.: 17/545,996

(22) Filed: Dec. 8, 2021

(65) Prior Publication Data

US 2023/0147806 A1      May 11, 2023

(30) Foreign Application Priority Data

Nov. 8, 2021      (TW) ................................. 110141457

(51) Int. Cl.
*H01L 23/528*      (2006.01)
*H01L 21/768*      (2006.01)
(Continued)

(52) U.S. Cl.
CPC .... *H01L 23/5283* (2013.01); *H01L 21/76816* (2013.01); *H01L 21/7682* (2013.01); (Continued)

(58) Field of Classification Search
CPC . H10D 62/351–371; H10D 30/47–485; H10D 30/015; H01L 23/473–4735
See application file for complete search history.

(56) References Cited

U.S. PATENT DOCUMENTS 8,026,596 B2    9/2011 Singhal et al.
9,318,417 B2    4/2016 Therrien et al.
(Continued)

FOREIGN PATENT DOCUMENTS

CN      103329256      9/2016
CN      106169470      11/2016
(Continued)

OTHER PUBLICATIONS

"Office Action of Taiwan Counterpart Application", issued on Oct. 19, 2022, p. 1-p. 5.
(Continued)

*Primary Examiner* — Steven B Gauthier
*Assistant Examiner* — Candice Chan
(74) *Attorney, Agent, or Firm* — JCIPRNET

(57)      ABSTRACT

A semiconductor structure including a substrate, a conductive layer, and a semiconductor device is provided. The substrate includes a first surface, a second surface opposite to the first surface, at least one insulating vacancy extending from the first surface toward the second surface, and a through hole passing through the substrate. The conductive layer fills in the through hole. The semiconductor device is disposed on the second surface and is electrically connected to the conductive layer, and the at least one insulating vacancy is distributed corresponding to the semiconductor device.

16 Claims, 16 Drawing Sheets

(51) Int. Cl.

| | |
|---|---|
| *H01L 23/522* | (2006.01) |
| *H01L 23/66* | (2006.01) |
| *H10D 30/01* | (2025.01) |
| *H10D 30/47* | (2025.01) |

(52) U.S. Cl.
CPC .... *H01L 21/76831* (2013.01); *H01L 23/5226* (2013.01); *H01L 23/66* (2013.01); *H01L 2223/6616* (2013.01); *H10D 30/015* (2025.01); *H10D 30/4755* (2025.01)

(56) References Cited

U.S. PATENT DOCUMENTS

| | | | |
|---|---|---|---|
| 9,536,965 | B2 | 1/2017 | Pei et al. |
| 10,312,358 | B2 | 6/2019 | Ren et al. |
| 2005/0067716 | A1 | 3/2005 | Mishra et al. |
| 2010/0295100 | A1 | 11/2010 | Huang et al. |
| 2020/0395474 | A1 | 12/2020 | Bothe et al. |
| 2022/0376085 | A1* | 11/2022 | Bothe ................. H10D 64/112 |

FOREIGN PATENT DOCUMENTS

| | | |
|---|---|---|
| CN | 111244050 | 6/2020 |
| CN | 113555343 | 10/2021 |
| JP | 2008117885 | 5/2008 |
| JP | 2010067662 | 3/2010 |
| JP | 2010080633 | 4/2010 |
| JP | 2011192836 | 9/2011 |
| JP | 2019537284 | 12/2019 |
| TW | 560020 | 11/2003 |
| TW | 200908273 | 2/2009 |
| TW | 201118957 | 6/2011 |
| TW | 201142999 | 12/2011 |
| TW | I385788 | 2/2013 |
| TW | 201438101 | 10/2014 |
| TW | 201935695 | 9/2019 |
| TW | 202137507 | 10/2021 |
| TW | 202137514 | 10/2021 |
| TW | 202320284 | 5/2023 |
| TW | 202423216 | 6/2024 |

OTHER PUBLICATIONS

Abdalla Eblabla et al., "Membrane Supported GaN CPW Structures for High-frequency and High-power Applications," 2019 IEEE Asia-Pacific Microwave Conference (APMC), Dec. 2019, pp. 1179-1181.

Ya-Hsi Hwang et al., "A Novel Approach to Improve Heat Dissipation of AlGaN/GaN High Electron Mobility Transistors with a Backside Cu via," ECS Transactions, vol. 66, Apr. 2015, pp. 223-230.

Miao Yu et al., "Numerical Study on Microjet Cooling Structure for GaN HEMTs Integration on Silicon," 2020 21st International Conference on Electronic Packaging Technology (ICEPT), Aug. 2020, pp. 1-6.

Kyu-Won Jang et al., "Thermal Analysis and Operational Characteristics of an AlGaN/GaN High Electron Mobility Transistor with Copper-Filled Structures: A Simulation Study," Micromachines, Dec. 2019, pp. 1-13.

A. Bar-Cohen et al., "Embedded Cooling for Wide Bandgap Power Amplifiers: A Review," Journal of Electronic Packaging, vol. 141, Dec. 2019, pp. 040803-1-040803-14.

Shawn S. H. Hsu et al., "GaN-on-silicon devices and technologies for RF and microwave applications," 2016 IEEE International Symposium on Radio-Frequency Integration Technology (RFIT), Aug. 2016, pp. 1-3.

* cited by examiner

SEMICONDUCTOR STRUCTURE INCLUDING INSULATING VACANCY FOR IMPROVING OPERATION PERFORMANCE AND METHOD OF FABRICATING THE SAME

CROSS-REFERENCE TO RELATED APPLICATION

This application claims the priority benefit of Taiwan application serial no. 110141457, filed on Nov. 8, 2021. The entirety of the above-mentioned patent application is hereby incorporated by reference herein and made a part of this specification.

BACKGROUND

Technical Field

The disclosure relates to a semiconductor structure and a method of fabricating the same, and in particular to a semiconductor structure, which reduces the high-frequency coupling effect of a semiconductor device, and a method of fabricating the same.

Description of Related Art

High electron mobility transistor (HEMT), also known as modulation-doped FET (MODFET), is a field effect transistor. Unlike a metal oxide semiconductor field effect transistor, in which a doped semiconductor is directly used to form a channel, a high electron mobility transistor includes two materials with different energy gaps to form a heterojunction to provide a channel for a carrier. Ternary compound semiconductors such as gallium arsenide and aluminum gallium arsenide are commonly used materials that constitute the high electron mobility transistor. In recent years, a GaN high electron mobility transistor is gaining traction due to good high-frequency characteristics thereof. High electron mobility transistors can be operated at high frequencies, so high electron mobility transistors have been widely used in mobile phones, satellite TVs, and radars. However, in the high electron mobility transistor, problems such as reduced device performance caused by a high-frequency coupling effect often occur.

SUMMARY

The disclosure provides a semiconductor structure having a semiconductor device and a method of fabricating the same to reduce a high frequency coupling effect of the semiconductor device in the semiconductor structure.

The disclosure provides a semiconductor structure including a substrate, a conductive layer, and a semiconductor device. The substrate includes a first surface, a second surface opposite to the first surface, at least one insulating vacancy extending from the first surface to the second surface, and a through hole passing through the substrate. The conductive layer fills in the through hole. The semiconductor device is disposed on the second surface, and the semiconductor device is electrically connected to the conductive layer, and the at least one insulating vacancy is distributed corresponding to the semiconductor device.

In an embodiment of the disclosure, the semiconductor device includes a transistor, a source of the transistor is grounded through the conductive layer, and the at least one insulating vacancy is located below a channel layer of the transistor to reduce a high frequency coupling effect of the channel layer. In an embodiment of the disclosure, the source is in contact with a top surface of the conductive layer through a bottom surface of a contact plug, and an area of the top surface of the conductive layer is greater than or equal to an area of the bottom surface of the contact plug. In an embodiment of the disclosure, the source is electrically connected to the conductive layer through a contact plug, and a bottom surface of the contact plug is in contact with a top surface of the conductive layer. In an embodiment of the disclosure, the at least one insulating vacancy extends from the first surface to the second surface to pass through the substrate. In an embodiment of the disclosure, a width of the through hole is less than or equal to a width of the at least one insulating vacancy. In an embodiment of the disclosure, a width of the through hole is greater than a width of the at least one insulating vacancy, and a depth of the at least one insulating vacancy is less than a thickness of the substrate. In an embodiment of the disclosure, the semiconductor structure further includes a liner, and the liner is at least located between the substrate and the conductive layer. In an embodiment of the disclosure, the semiconductor structure further includes a support substrate, and the conductive layer is bonded to the support substrate.

The disclosure provides a method of fabricating a semiconductor structure, which includes the following. A substrate is provided, and the substrate includes a first surface and a second surface opposite to the first surface. A semiconductor device is formed on the second surface of the substrate. At least one insulating vacancy and a through hole passing through the substrate are formed in the substrate, and the insulating vacancy extends from the first surface to the second surface, and the at least one insulating vacancy passes through the substrate. A conductive layer is formed in the through hole, and the semiconductor device is electrically connected to the conductive layer, and the at least one insulating vacancy is distributed corresponding to the semiconductor device. In an embodiment of the disclosure, the at least one insulating vacancy and the through hole are formed after the semiconductor device is formed. In an embodiment of the disclosure, the method of fabricating a semiconductor structure further includes the following. The substrate on which the semiconductor device is formed is bonded to a carrier substrate, so that the semiconductor device is located between the substrate and the carrier substrate. In an embodiment of the disclosure, the at least one insulating vacancy and the through hole are formed in the substrate at the same time. In an embodiment of the disclosure, the at least one insulating vacancy extends from the first surface to the second surface to pass through the substrate, and a width of the through hole is less than or equal to a width of the at least one insulating vacancy. In an embodiment of the disclosure, a width of the through hole is greater than a width of the at least one insulating vacancy, and a depth of the at least one insulating vacancy is less than a thickness of the substrate. In an embodiment of the disclosure, the method of fabricating a semiconductor structure further includes the following. A liner is formed, and the liner is at least located between the substrate and the conductive layer. In an embodiment of the disclosure, the method of fabricating a semiconductor structure further includes the following. A support substrate is provided, and the conductive layer is bonded to the support substrate.

Based on the above, in the embodiment of the disclosure, the high-frequency coupling effect of the semiconductor device is effectively reduced through the insulating vacancy formed on the substrate, thereby improving the performance of the semiconductor device. In addition, in the embodiment of the disclosure, the insulating vacancy and the through hole are produced in the same process, thereby improving the performance of the semiconductor device without significantly increasing the cost of the process.

DESCRIPTION OF THE EMBODIMENTS

Figure 5:
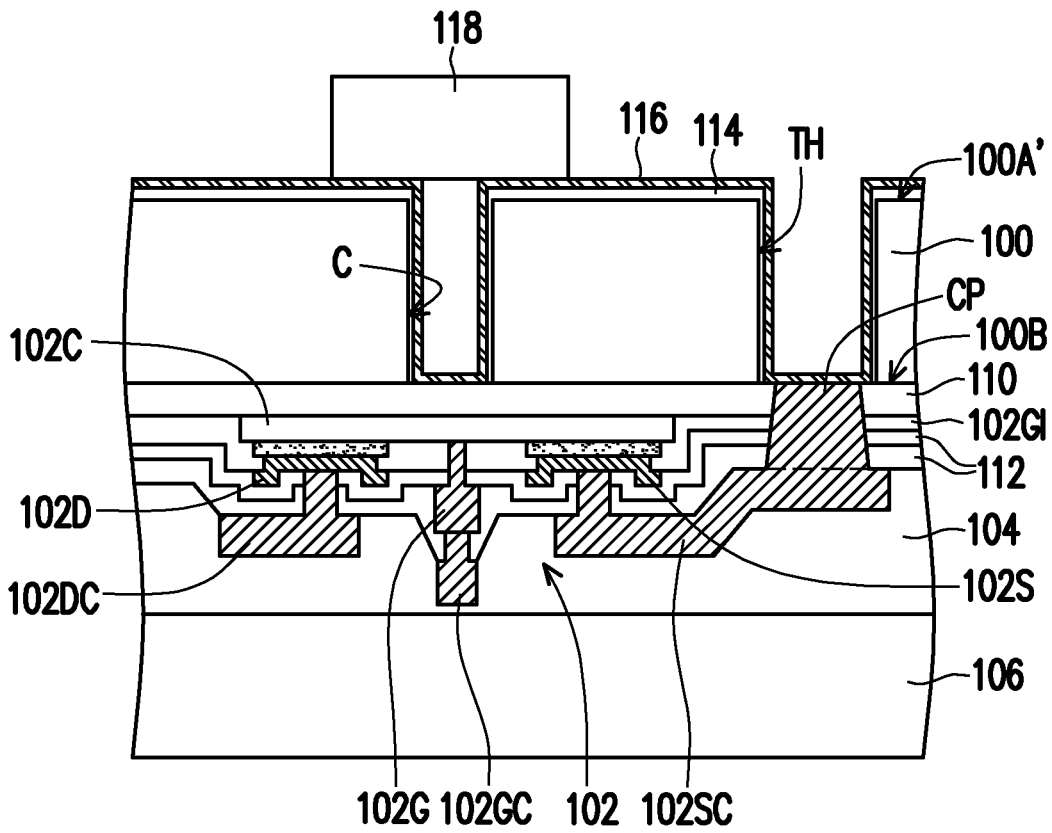
Figure 6:
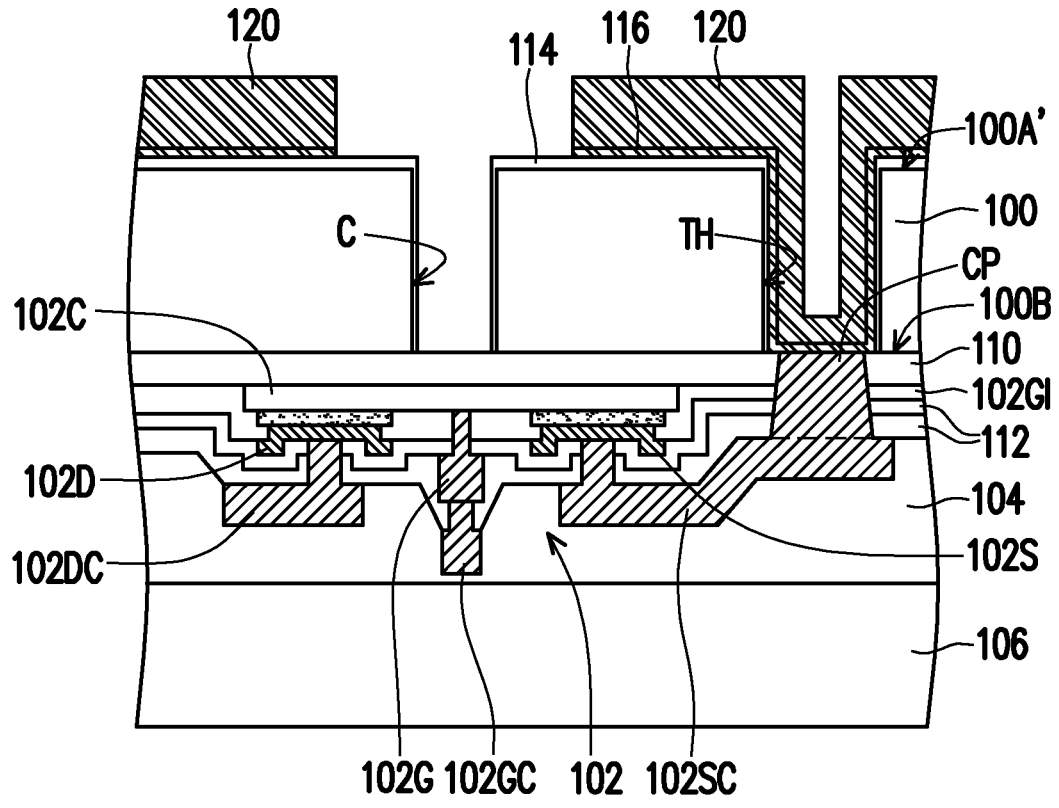
Figure 7:
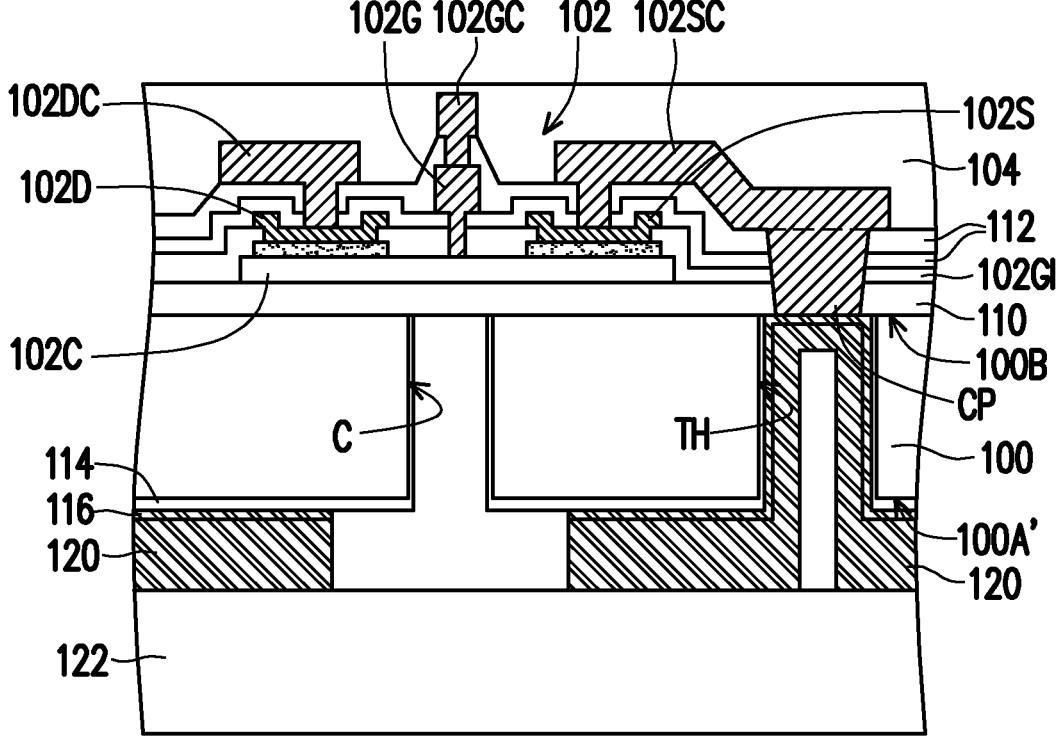
FIGS. 7 and 8 are a schematic cross-sectional view and a schematic perspective view of a semiconductor structure according to an embodiment of the disclosure.
Figure 8:
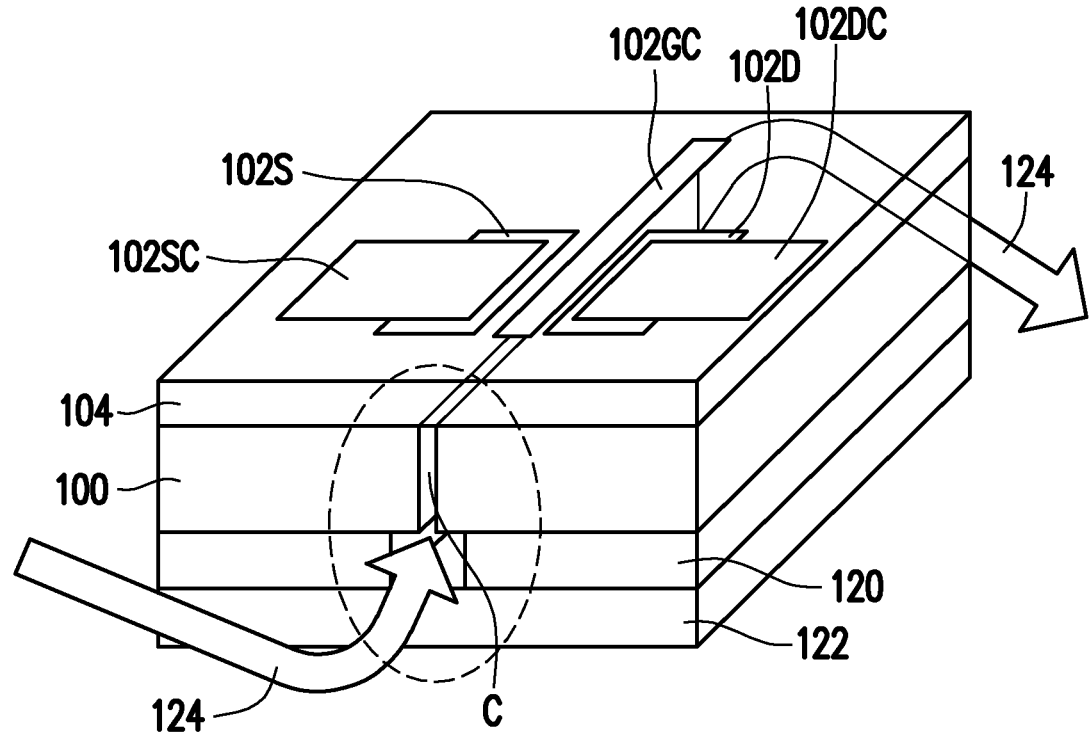

FIGS. 1 to 6 are schematic cross-sectional views of fabricating a semiconductor structure according to an embodiment of the disclosure, and FIGS. 7 and 8 are a schematic cross-sectional view and a schematic perspective view of a semiconductor structure according to an embodiment of the disclosure.

Figure 1:
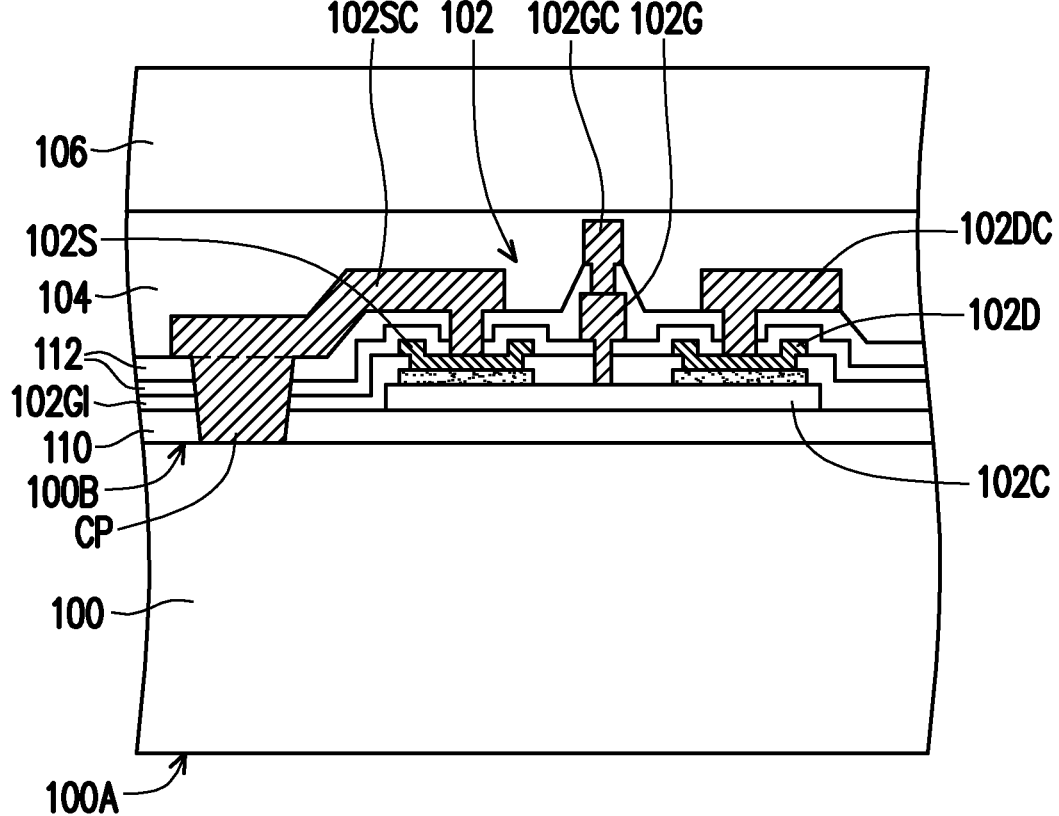
FIGS. 1 to 6 are schematic cross-sectional views of fabricating a semiconductor structure according to an embodiment of the disclosure.

Referring to FIG. 1, a substrate 100 is provided. The substrate 100 has a first surface 100A and a second surface 100B (for example, a top surface) opposite to the first surface 100A (for example, a bottom surface). In some embodiments, the material of the substrate 100 includes silicon or other suitable semiconductor materials. A semiconductor device 102 is formed on the second surface 100B of the substrate 100. Next, a bonding dielectric layer 104 is formed on the second surface 100B of the substrate 100 to cover the semiconductor device 102. A carrier substrate 106 is provided, and the substrate 100 formed with the semiconductor device 102 and the bonding dielectric layer 104 is bonded to the carrier substrate 106, so that the semiconductor device 102 and the bonding dielectric layer 104 are located between the substrate 100 and the carrier substrate 106. In some embodiments, the material of the bonding dielectric layer 104 includes silicon oxide or other suitable dielectric materials. In this embodiment, the bonding dielectric layer 104 formed on the substrate 100 is directly bonded to the carrier substrate 106, so that the semiconductor device 102 and the bonding dielectric layer 104 are located between the substrate 100 and the carrier substrate 106. In some embodiments, the material of the carrier substrate 106 includes silicon, glass or other suitable semiconductor materials.

In this embodiment, the semiconductor device 102 includes a transistor. The transistor includes a gate 102G, a gate insulating layer 102GI, a source 102S, a drain 102D, and a channel layer 102C. The gate 102G, the source 102S, and the drain 102D are located above the channel layer 102C, and the gate 102G and the channel layer 102C are separated by the gate insulating layer 102GI, and the source 102S and the drain 102D are located on two sides of the gate 102G, and an ohmic contact is formed respectively between the source 102S and the channel layer 102C and between the drain 102D and the channel layer 102C. In other embodiments, the gate insulating layer 102GI may not be included in the transistor; in other words, the gate insulating layer

102GI is an optional component in the transistor. In some embodiments, the transistor is formed on the substrate 100 with a buffer compound semiconductor layer 110, and the buffer compound semiconductor layer 110 is formed on the second surface 100B of the substrate 100. In some embodiments, the transistor may further include at least one protective layer 112, and the protective layer 112 covers the gate 102G, the source 102S, and the drain 102D. In some embodiments, the semiconductor device 102 includes a high electron mobility transistor (HEMT), and the material of the channel layer 102C in the high electron mobility transistor includes GaN, AlGaN, InGaN or other suitable semiconductor materials, and the material of the buffer compound semiconductor layer 110 includes GaN, AlGaN, InGaN or other suitable semiconductor materials, and the material of the channel layer 102C and the material of the buffer compound semiconductor layer 110 may be the same or different.

In some embodiments, the transistor may further include a gate contact conductor 102GC, a source contact conductor 102SC, and a drain contact conductor 102DC. The gate contact conductor 102GC is disposed on the gate 102G and is electrically connected to the gate 102G, the source contact conductor 102SC is disposed on the source 102S and is electrically connected to the source 102S, and the drain contact conductor 102DC is disposed on the drain 102D and is electrically connected to the drain 102D. In addition, the transistor may further include a contact plug CP. The source contact conductor 102SC extends laterally from above the source 102S to above the contact plug CP, and the contact plug CP passes through the protective layer 112, the gate insulating layer 102GI, and the buffer compound semiconductor layer 110, so as to be in contact with the second surface 100B of the substrate 100. In other words, the source 102S is electrically connected to the contact plug CP through the source contact conductor 102SC.

Figure 2:
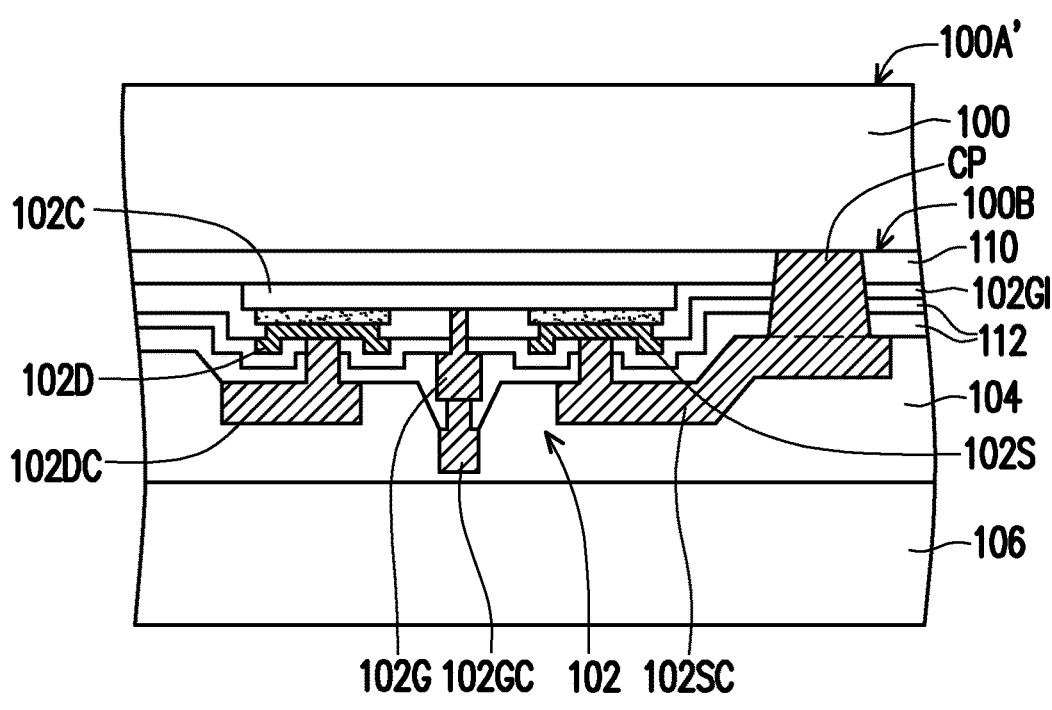

Referring to FIG. 2, the structure in FIG. 1 is turned over so that the first surface 100A of the substrate 100 faces upward. Next, a thinning process is performed to reduce the thickness of the substrate 100. In this embodiment, the thinning process of the substrate 100 is performed on the first surface 100A of the substrate 100 to reduce the distance between the first surface 100A and the second surface 100B of the substrate 100. In some embodiments, the thinning process of the substrate 100 includes chemical mechanical polishing (CMP), mechanical grinding, or a combination of the foregoing processes. In this embodiment, the thickness of the substrate 100 after thinning is between 20 microns and 200 microns.

Figure 3:
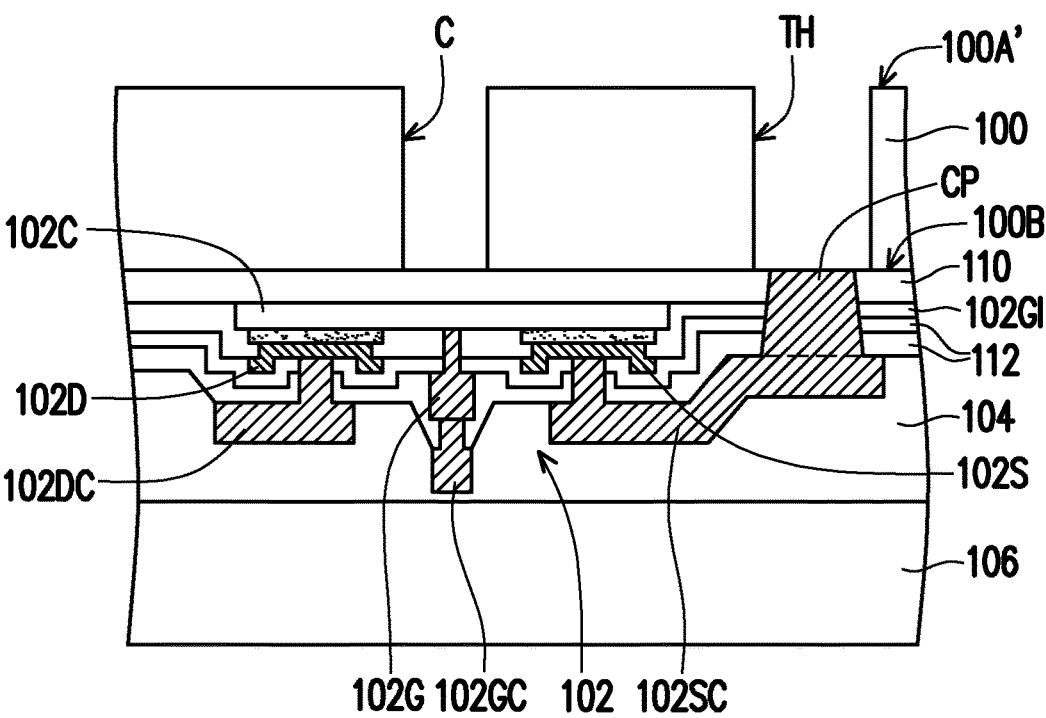

Referring to FIG. 3, after the substrate 100 is thinned, a patterning process is performed to pattern the substrate 100. In this embodiment, the patterning process of the substrate 100 is performed on a thinned first surface 100A' of the substrate 100 to simultaneously form at least one insulating vacancy C and a through hole TH in the substrate 100. The insulating vacancy C extends from the first surface 100A' to the second surface 100B to pass through the substrate 100, and the through hole TH extends from the first surface 100A' to the second surface 100B to pass through the substrate 100. In other words, the depth of the insulating vacancy C and the depth of the through hole TH are substantially the same as the thickness of the thinned substrate 100. In this embodiment, the width of the through hole TH may be greater than or substantially equal to the width of the insulating vacancy C.

As shown in FIG. 3, the through hole TH exposes a bottom surface of the contact plug CP and a portion of a bottom surface of the buffer compound semiconductor layer 110. The insulating vacancy C also exposes a portion of the bottom surface of the buffer compound semiconductor layer 110, and the insulating vacancy C is distributed below the semiconductor device 102. In this embodiment, the insulating vacancy C is located below the gate 102G and the channel layer 102C of the transistor to reduce the high frequency coupling effect of the channel layer 102C.

Figure 4:
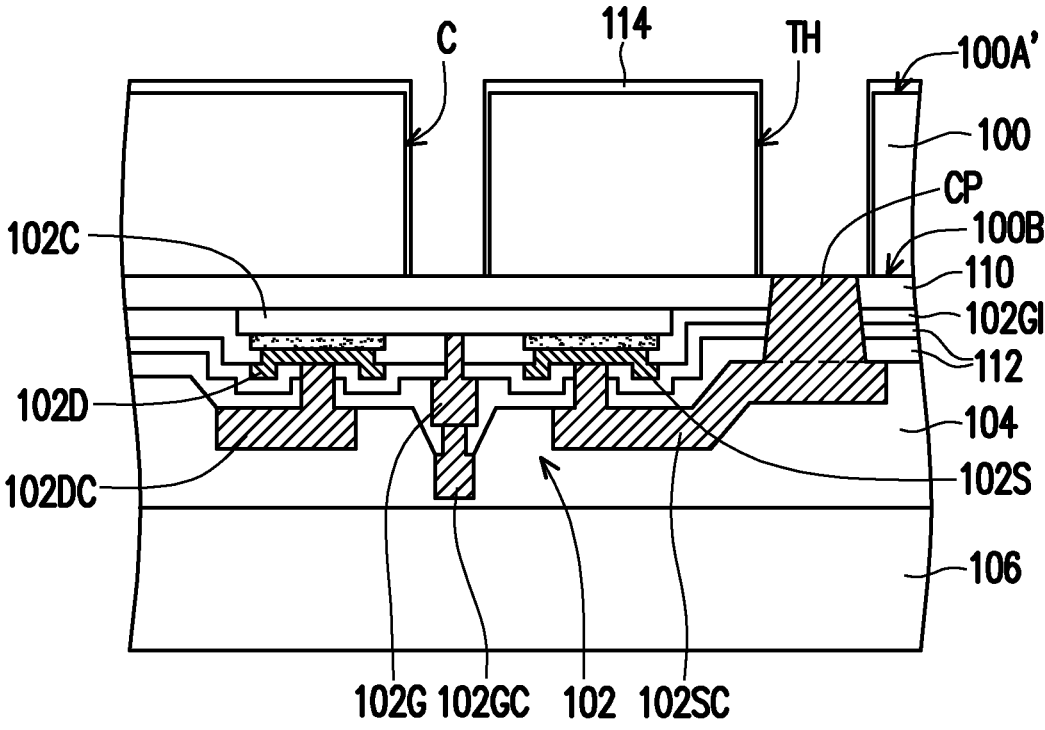

Referring to FIG. 4, a liner 114 is formed on the substrate 100. The liner 114 is distributed on the first surface 100A' of the substrate 100 and a side wall used to define the insulating vacancy C and the through hole TH, but the liner 114 does not cover the bottom surface of the contact plug CP. For example, a dielectric material may be formed on the substrate 100 by means of atomic layer deposition (ALD), chemical vapor deposition, physical vapor deposition, etc. Next, the dielectric material in contact with the bottom surface of the contact plug CP is removed by etching to form the liner 114. In some embodiments, the liner 114 is in contact with the buffer compound semiconductor layer 110 exposed by the insulating vacancy C and the through hole TH. In addition, the material of the liner 114 includes silicon oxide or other suitable dielectric materials.

Referring to FIG. 5, a seed layer 116 is formed on the substrate 100. The seed layer 116 covers the liner 114. Since the liner 114 does not cover the bottom surface of the contact plug CP, the seed layer 116 is in contact with the bottom surface of the contact plug CP that is not covered by the liner 114. In some embodiments, the seed layer 116 is in contact with the buffer compound semiconductor layer 110 that is not covered by the liner 114. The seed layer 116 may be fully deposited on the liner 114 and the contact plug CP that is not covered by the liner 114 and on the bottom surface of the insulating vacancy C through a sputtering process. In addition, the seed layer 116 may serve as an electroplating seed layer required for a subsequent electroplating process and provide an effect of a barrier layer.

Next, a mask layer 118 is formed on the first surface 100A' of the substrate 100 to cover the insulating vacancy C and the seed layer 116 located near the insulating vacancy C. In this embodiment, as shown in FIG. 5, the mask layer 118 includes a patterned dry film with a specific pattern. When the patterned dry film is attached to the seed layer 116, the patterned dry film may cover the insulating vacancy C, but not fill in the insulating vacancy C. In some other feasible embodiments, not shown in the figures, the mask layer 118 includes a patterned photoresist layer formed by a spin coating process. When the patterned photoresist layer is formed on the seed layer 116, the patterned photoresist layer may cover and fill in the insulating vacancy C.

Referring to FIGS. 5 and 6, an electroplating process may be performed to form a conductive layer 120 on the seed layer 116 not covered by the mask layer 118, and the conductive layer 120 fills in the insulating vacancy C. In this embodiment, the through hole TH is partially filled in by the conductive layer 120. In other embodiments, not shown, the through hole TH may be completely filled in by the conductive layer 120. After the conductive layer 120 is formed, the mask layer 118 is removed to expose a portion of the seed layer 116 that is not covered by the conductive layer 120. Next, the seed layer 116 that is not covered by the conductive layer 120 is removed until a portion of the liner 114 of is exposed. As shown in FIG. 6, the liner 114 is at least located between the substrate 100 and the conductive layer 120. In other words, the substrate 100 may be separated from the conductive layer 120 by the liner 114.

The source 102S is grounded through the source contact conductor 102SC, the conductive plug CP, and the conductive layer 120. Compared with wire bonding, the wiring distance required for grounding the source 102S may be reduced, thereby reducing related issues such as parasitic inductance. The insulating vacancy C located below the channel layer 102C of the transistor may reduce the high frequency coupling effect of the channel layer 102C.

Referring to FIGS. 7 and 8, after the conductive layer 120 is formed, a support substrate 122 is provided, and the conductive layer 120 formed on the substrate 100 and the support substrate 122 are bonded together. In this embodiment, the material of the support substrate 122 includes silicon, organic carrier board or other suitable semiconductor or encapsulating materials. Next, the carrier substrate 106 is separated from the bonding dielectric layer 104, so that the carrier substrate 106 is delaminated from the bonding dielectric layer 104. As shown in FIG. 8, the insulating vacancy C located between the support substrate 122 and the semiconductor device 102 may selectively allow a heat dissipating liquid 124 (for example, cooling water or other cooling fluids with good heat dissipation) to pass through, so as to improve the overall heat dissipation efficiency of the semiconductor structure.

Figure 9:
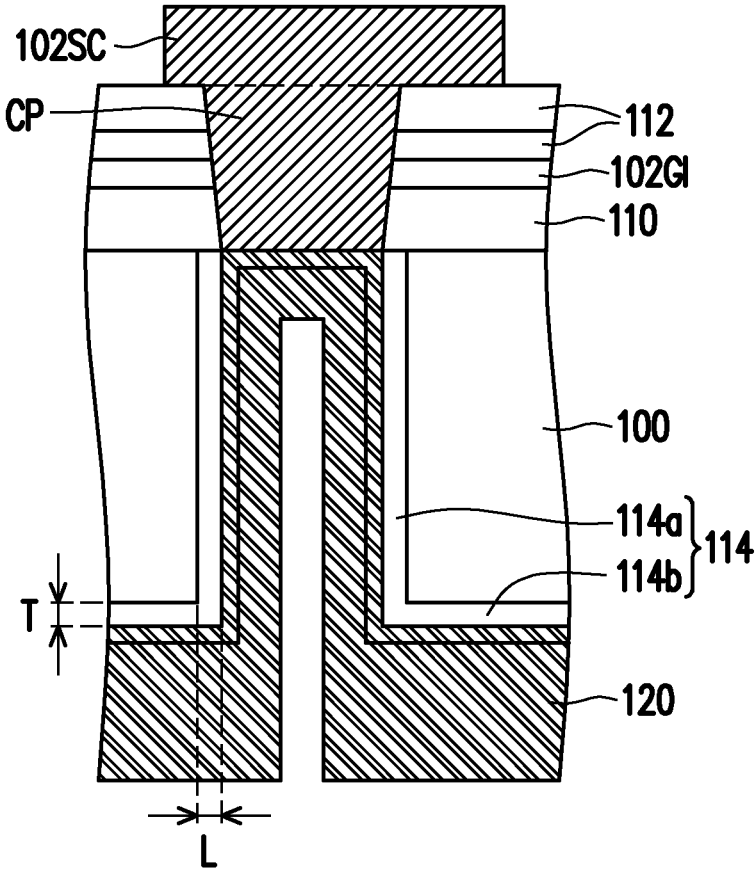
FIGS. 9 and 10 respectively illustrate schematic cross-sectional views of a liner, a conductive layer, and a contact plug in a semiconductor structure.
Figure 10:
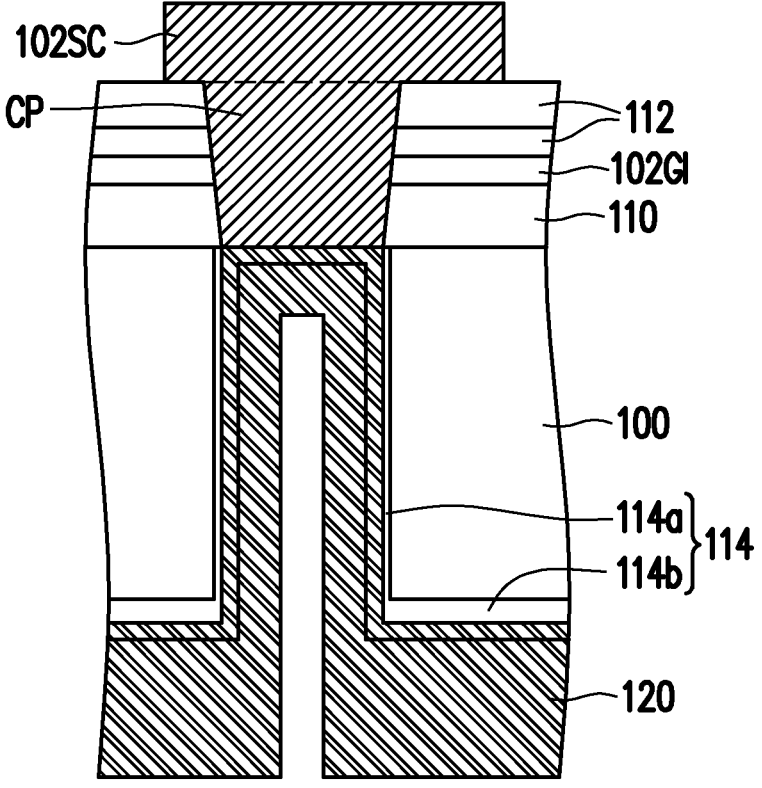

FIGS. 9 and 10 respectively illustrate schematic cross-sectional views of a liner, a conductive layer, and a contact plug in a semiconductor structure.

Referring to FIG. 9, the liner 114 includes a first portion 114a covering a side wall of the substrate 100 and a second portion 114b covering the first surface 100A' of the substrate 100. The first portion 114a is located in the through hole TH, and a thickness L of the first portion 114a may be substantially equal to a thickness T of the second portion 114b. In this embodiment, the bottom surface of the contact plug CP is in contact with the top surface of the conductive layer 120; the size of the through hole TH is larger than the size of the bottom surface of the contact plug CP; the minimum size difference may be equal to the thickness T of the second portion 114b; and the area of the top surface of the conductive layer 120 is substantially equal to the area of the bottom surface of the contact plug CP. At this time, the liner 114 is in contact with the bottom surface of the contact plug CP, and the substrate 100 is not in contact with the contact plug CP. In some other embodiments, the area of the top surface of the conductive layer 120 is larger than the area of the bottom surface of the contact plug CP. At this time, the liner 114 is not in contact with the bottom surface of the contact plug CP.

Referring to FIG. 10, the liner 114 includes the first portion 114a covering the side wall of the substrate 100 and the second portion 114b covering the first surface 100A of the substrate 100. The first portion 114a is located in the through hole TH, and the thickness L of the first portion 114a is less than the thickness T of the second portion 114b, and the thickness L of the first portion 114a is about 5% of the thickness T of the second portion 114b. In this embodiment, the bottom surface of the contact plug CP is in contact with the top surface of the conductive layer 120; the size of the through hole TH is larger than the size of the bottom surface of the contact plug CP; the minimum size difference may be equal to the thickness T of the second portion 114b; and the area of the top surface of the conductive layer 120 is substantially equal to the area of the bottom surface of the contact plug CP. At this time, the liner 114 is in contact with the bottom surface of the contact plug CP, and the substrate 100 is not in contact with the contact plug CP. In some other embodiments, the area of the top surface of the conductive layer 120 is larger than the area of the bottom surface of the contact plug CP. At this time, the liner 114 is not in contact with the bottom surface of the contact plug CP.

FIGS. 11 to 18 are schematic cross-sectional views of a semiconductor structure according to different embodiments of the disclosure.

Figure 11:
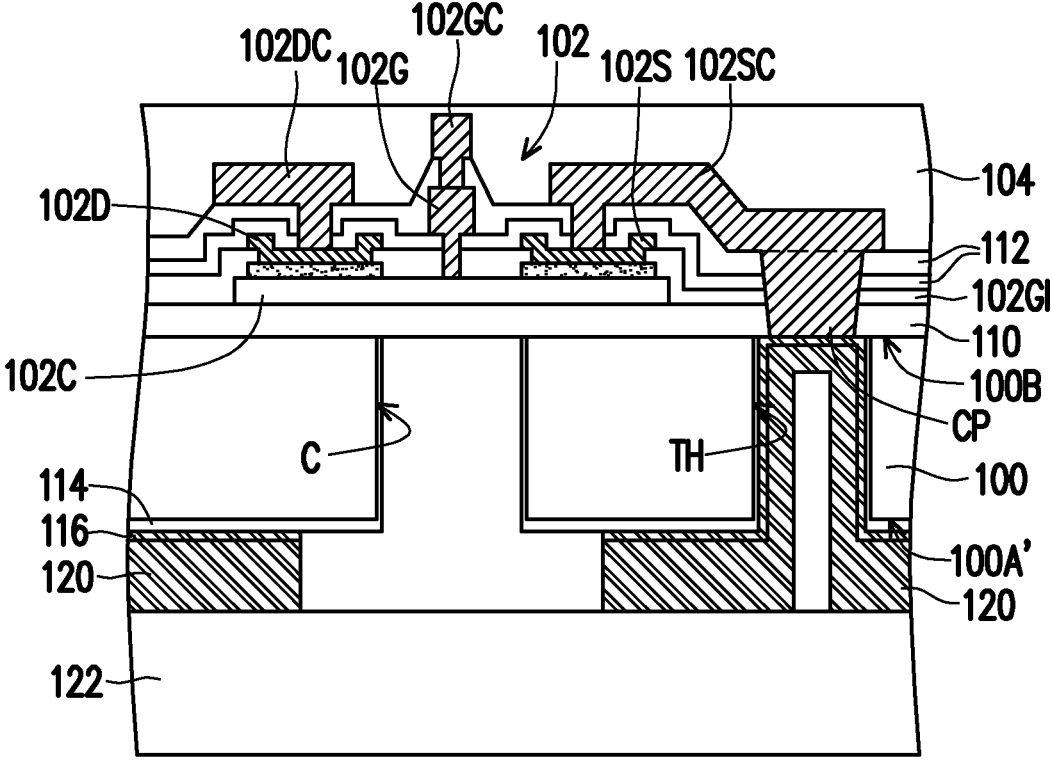
FIGS. 11 to 18 are schematic cross-sectional views of a semiconductor structure according to different embodiments of the disclosure.

Referring to FIGS. 7 and 11, a semiconductor structure illustrated in FIG. 11 is similar to the semiconductor structure illustrated in FIG. 7, and the difference is that the insulating vacancy C illustrated in FIG. 11 is wider, so that the width of the through hole TH in the semiconductor structure is smaller than the width of the insulating vacancy C. In this embodiment, the insulating vacancy C is located below the gate 102G and the channel layer 102C of the transistor to reduce the high frequency coupling effect of the channel layer 102C.

Figure 12:
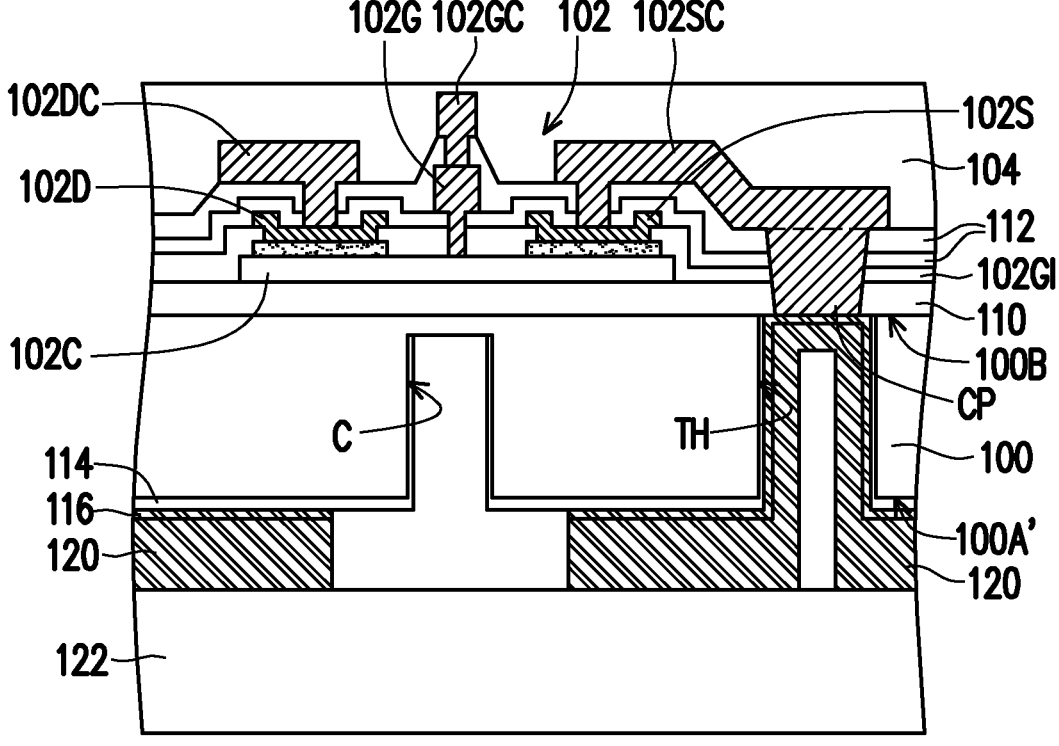

Referring to FIGS. 7 and 12, a semiconductor structure illustrated in FIG. 12 is similar to the semiconductor structure illustrated in FIG. 7, and the difference is that the depth of the insulating vacancy C illustrated in FIG. 12 is smaller than the thickness of substrate 100. In other words, the insulating vacancy C extends from the first surface 100A' to the second surface 100B of the substrate 100, but the insulating vacancy C does not pass through the substrate.

Figure 13:
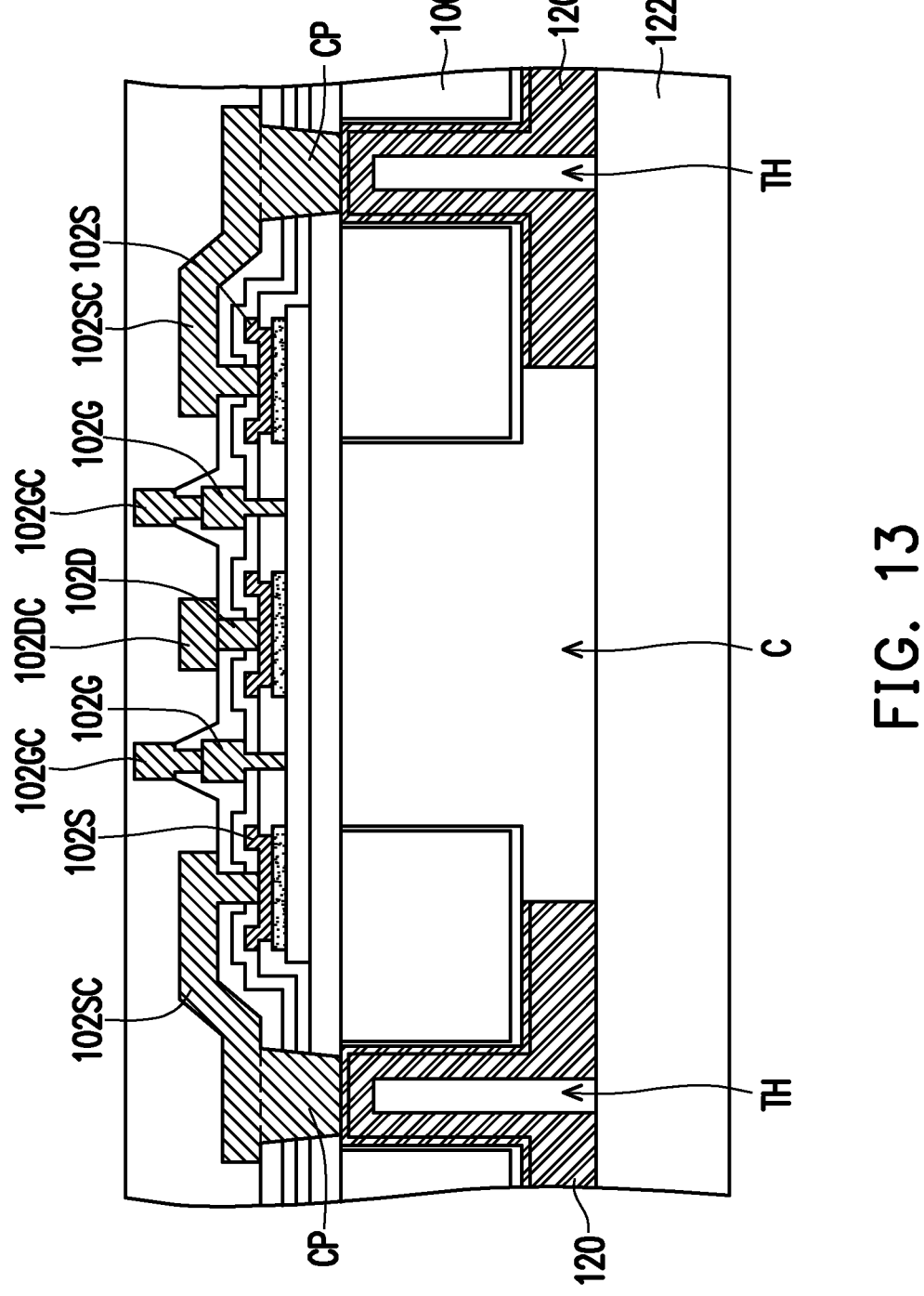

Referring to FIG. 13, the semiconductor device 102 includes a shared drain 102D and a plurality of sources 102S. In some embodiments, the semiconductor device 102 adopts the drain 102D and the source 102S of finger-like design. The number of through holes TH in the substrate 100 is more than one, and a plurality of conductive layers 120 located in the through holes TH are respectively electrically connected to the corresponding sources 102S. In this embodiment, the insulating vacancy C is located below the gate 102G, the drain 102D, the source 102S, and the channel layer 102C of the transistor to reduce the high frequency coupling effect of the channel layer 102C.

Figure 14:
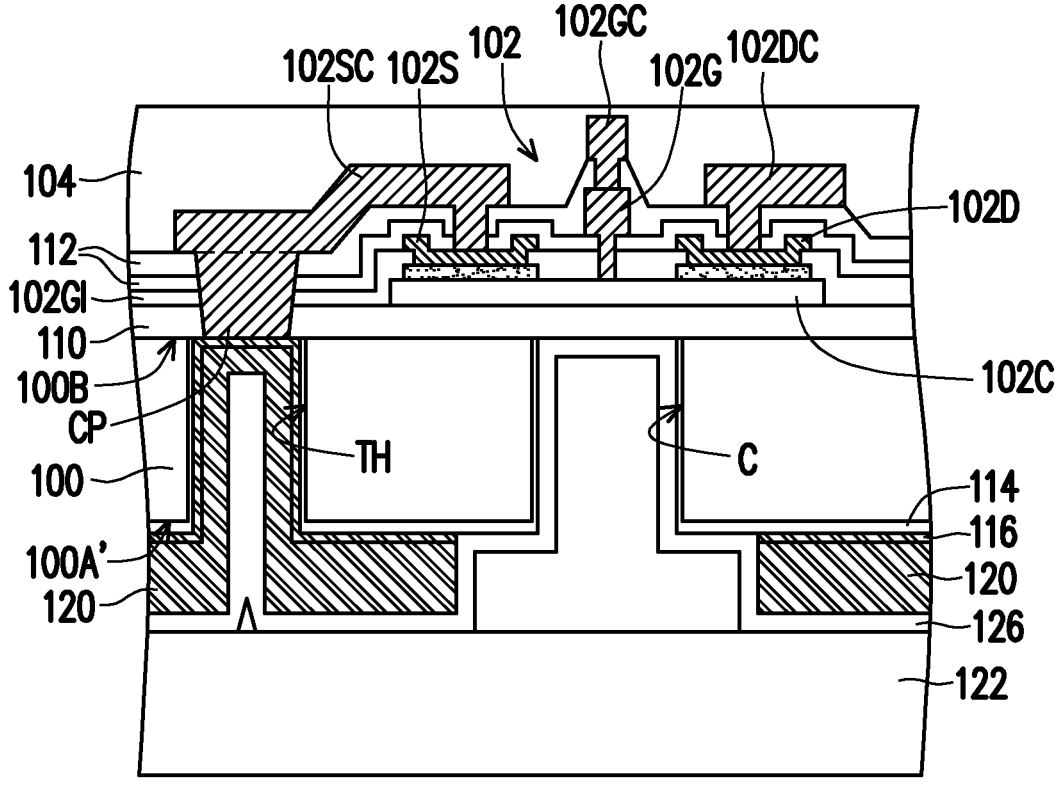
Figure 15:
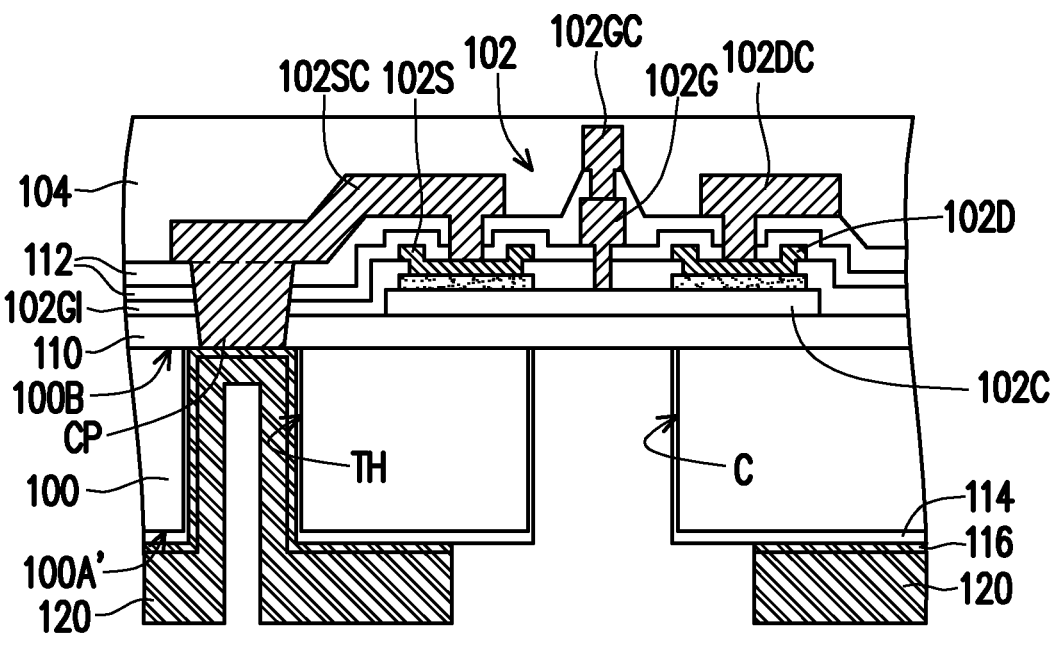
Figure 16:
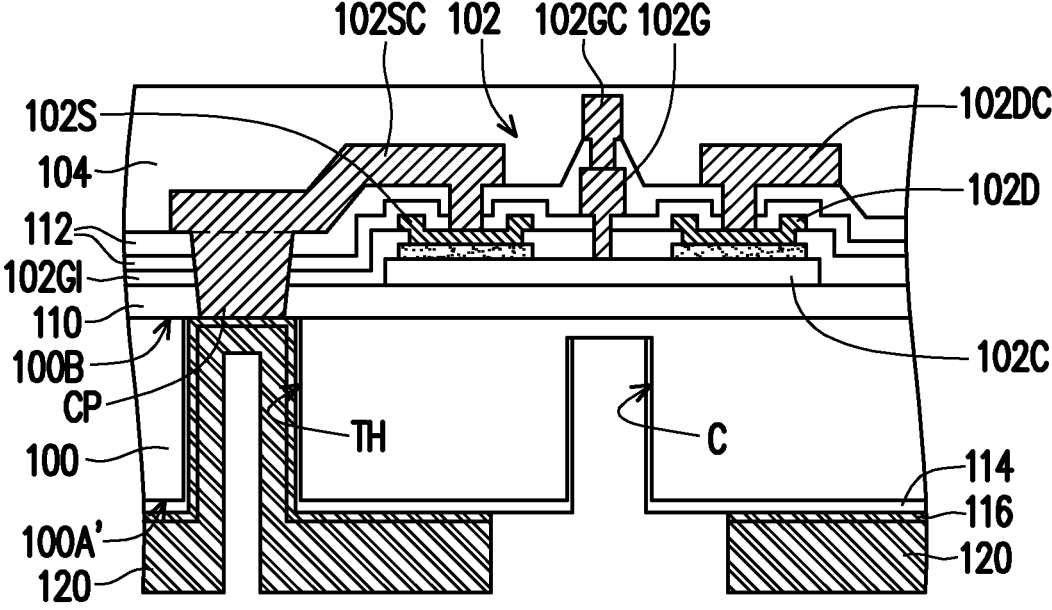
Figure 17:
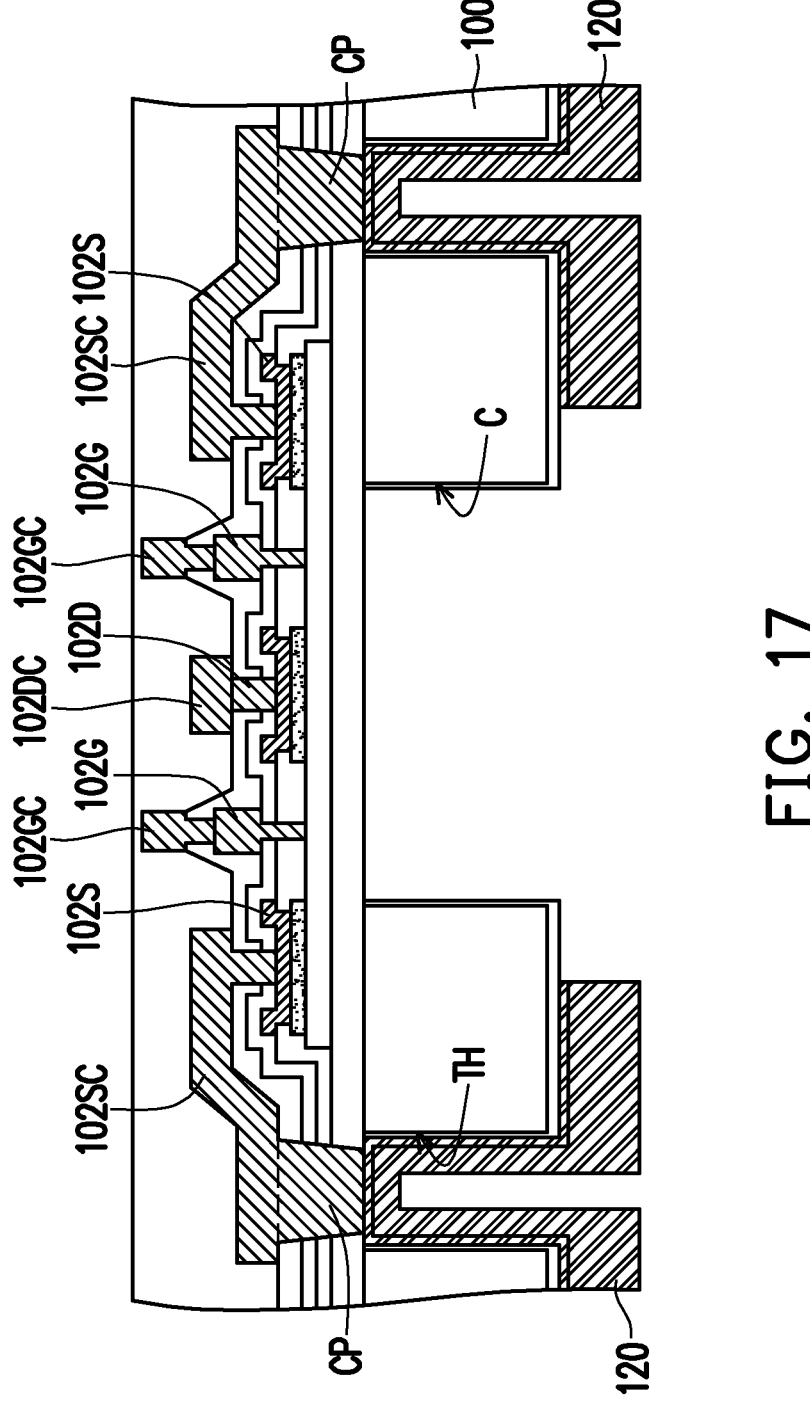
Figure 18:
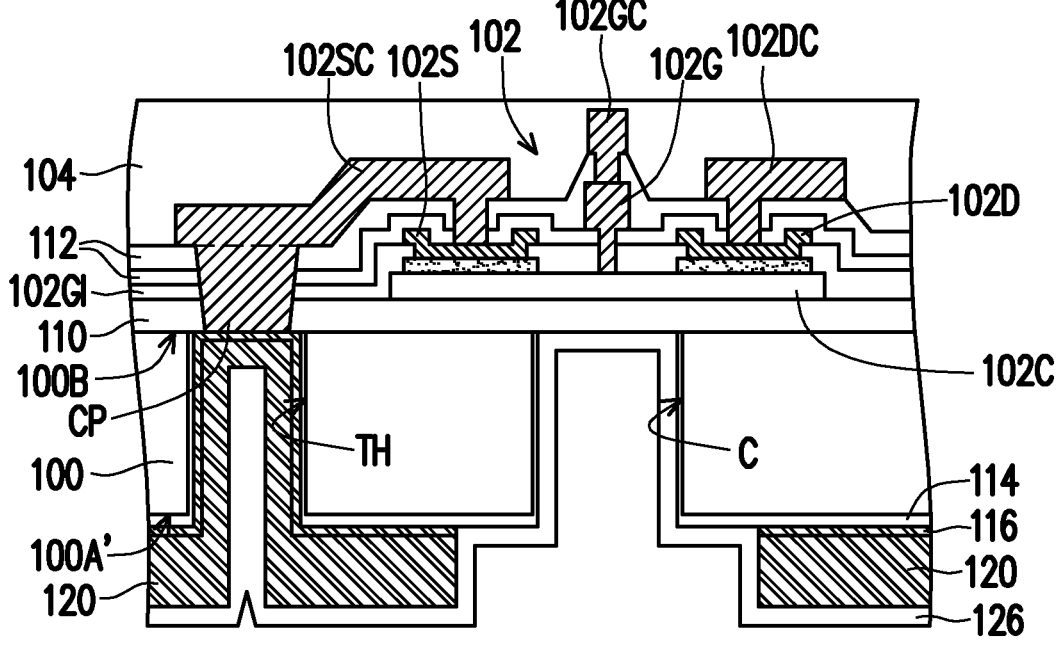

Referring to FIGS. 11 and 14, a semiconductor structure illustrated in FIG. 14 is similar to the semiconductor structure illustrated in FIG. 11, and the difference is that the semiconductor structure illustrated in FIG. 14 further includes a dielectric layer 126, and this dielectric layer covers the conductive layer, the liner not covered by the conductive layer, and a portion of the area of the semiconductor device exposed by the insulating vacancy. The dielectric layer 126 may be an organic adhesive material, such as polyimide, benzocyclobutene (BCB), or other suitable dielectric layer materials.

Referring to FIGS. 15 to 18, a semiconductor structure illustrated in FIGS. 15 to 18 is similar to the semiconductor structure illustrated in FIGS. 11 to 14, and the difference is that the semiconductor structure in FIGS. 15 to 18 does not include the support substrate 122 bonded to the conductive layer 120.

In summary, in the above-mentioned embodiment of the disclosure, the distance of wiring for grounding the source may be reduced without significantly increasing the cost of the process, thereby avoiding related problems such as parasitic inductance, and the high-frequency coupling effect of the channel layer may be effectively reduced.

What is claimed is:

1. A semiconductor structure, comprising:
a substrate, comprising a first surface, a second surface opposite to the first surface, an insulating vacancy extending from the first surface to the second surface, and a through hole passing through the substrate;
a conductive layer, filling in the through hole; and a semiconductor device, disposed on the second surface and electrically connected to the conductive layer,
wherein the semiconductor device comprises a transistor having a gate, a channel layer and a source, the source is grounded through the conductive layer, and the insulating vacancy is located below the channel layer and the gate, the conductive layer in the through hole is not in contact with the channel layer of the transistor, and the insulating vacancy extends between the first and second surfaces of the substrate.

2. The semiconductor structure according to claim 1, wherein the source is in contact with a top surface of the conductive layer through a bottom surface of a contact plug, and an area of the top surface of the conductive layer is greater than or equal to an area of the bottom surface of the contact plug.

3. The semiconductor structure according to claim 1, wherein the source is electrically connected to the conductive layer through a contact plug, and a bottom surface of the contact plug is in contact with a top surface of the conductive layer.

4. The semiconductor structure according to claim 1, wherein the insulating vacancy extends from the first surface to the second surface to pass through the substrate.

5. The semiconductor structure according to claim 4, wherein a width of the through hole is less than or equal to a width of the insulating vacancy.

6. The semiconductor structure according to claim 1, wherein a width of the through hole is greater than a width of the insulating vacancy, and a depth of the insulating vacancy is less than a thickness of the substrate.

7. The semiconductor structure according to claim 1, further comprising:
a liner, wherein the liner is at least located between the substrate and the conductive layer.

8. The semiconductor structure according to claim 1, further comprising:
a support substrate, wherein the conductive layer is bonded to the support substrate.

9. A method of fabricating a semiconductor structure, comprising:
providing a substrate, wherein the substrate comprises a first surface and a second surface opposite to the first surface;
forming a semiconductor device on the second surface of the substrate, wherein the semiconductor device comprises a transistor having a gate, a channel layer and a source;
forming an insulating vacancy extending from the first surface to the second surface and a through hole passing through the substrate, wherein the insulating vacancy is located below the channel layer and the gate, a conductive layer in the through hole is not in contact with the channel layer of the transistor, and the insulating vacancy extends between the first and second surfaces of the substrate; and
forming the conductive layer in the through hole, wherein the source of the transistor is grounded through the conductive layer, and the semiconductor device is electrically connected to the conductive layer.

10. The method of fabricating a semiconductor structure according to claim 9, wherein the insulating vacancy and the through hole are formed after the semiconductor device is formed.

11. The method of fabricating a semiconductor structure according to claim 10, further comprising:

bonding the substrate on which the semiconductor device is formed to a carrier substrate, so that the semiconductor device is located between the substrate and the carrier substrate.

12. The method of fabricating a semiconductor structure according to claim 9, wherein the insulating vacancy and the through hole are formed in the substrate at the same time.

13. The method of fabricating a semiconductor structure according to claim 9, wherein a width of the through hole is less than or equal to a width of the insulating vacancy.

14. The method of fabricating a semiconductor structure according to claim 9, wherein a width of the through hole is greater than a width of the insulating vacancy, and a depth of the insulating vacancy is less than a thickness of the substrate.

15. The method of fabricating a semiconductor structure according to claim 9, further comprising:

forming a liner, wherein the liner is at least located between the substrate and the conductive layer.

16. The method of fabricating a semiconductor structure according to claim 9, further comprising:

providing a support substrate, and bonding the conductive layer to the support substrate.

* * * * *